US010498345B1

United States Patent
Rakshit et al.

(10) Patent No.: US 10,498,345 B1
(45) Date of Patent: Dec. 3, 2019

(54) MULTIPLE INJECTION LOCK RING-BASED PHASE INTERPOLATOR

(71) Applicant: Cadence Design Systems, Inc., San Jose, CA (US)

(72) Inventors: Sambarta Rakshit, Ellicott City, MD (US); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/640,021

(22) Filed: Jun. 30, 2017

(51) Int. Cl.
| *H03L 7/099* | (2006.01) |
| *H03L 7/083* | (2006.01) |
| *H03L 7/24* | (2006.01) |
| *H03K 3/03* | (2006.01) |
| *H03L 7/07* | (2006.01) |
| *H03L 7/091* | (2006.01) |

(52) U.S. Cl.
CPC ......... *H03L 7/0995* (2013.01); *H03K 3/0315* (2013.01); *H03L 7/07* (2013.01); *H03L 7/083* (2013.01); *H03L 7/091* (2013.01); *H03L 7/0998* (2013.01); *H03L 7/24* (2013.01)

(58) Field of Classification Search
CPC ......... H03L 7/0995; H03L 7/07; H03L 7/083; H03L 7/091; H03L 7/0998; H03L 7/24; H03K 3/0315
See application file for complete search history.

(56) References Cited

U.S. PATENT DOCUMENTS

| 5,485,490 | A  | * | 1/1996 | Leung | .......... | H03K 3/0231 |
| | | | | | | 327/144 |
| 7,256,636 | B2 | * | 8/2007 | Kumar | .......... | H03L 7/0812 |
| | | | | | | 327/271 |
| 7,884,660 | B2 | | 2/2011 | Delage | | |
| 8,063,685 | B1 | | 11/2011 | Naviasky et al. | | |
| 8,081,024 | B1 | | 12/2011 | Evans | | |
| 8,710,929 | B1 | | 4/2014 | Naviasky | | |
| 8,847,691 | B2 | * | 9/2014 | Zhu | .......... | H03L 7/0805 |
| | | | | | | 327/156 |
| 2003/0006817 | A1 | * | 1/2003 | Seo | .......... | H03K 5/13 |
| | | | | | | 327/276 |
| 2003/0122599 | A1 | * | 7/2003 | Kim | .......... | H03L 7/07 |
| | | | | | | 327/161 |
| 2006/0181357 | A1 | * | 8/2006 | Chae | .......... | H03K 3/0322 |
| | | | | | | 331/57 |

OTHER PUBLICATIONS

U.S. Appl. No. 15/680,703, Examiner Interview Summary dated Sep. 20, 2018.

(Continued)

*Primary Examiner* — Janice N Tieu
(74) *Attorney, Agent, or Firm* — Schwegman Lundberg & Woessner, P.A.

(57) ABSTRACT

Various embodiments described herein provide a multiple injection lock ring-based PI that can inject a plurality of clock signals, of different phases, at injection points disposed along the ring chain of the PI and lock phase to those received clock signals (injected clock signals). For instance, an embodiment described herein may provide a multiple injection lock ring-based PI that permits double injection, triple injection, or the like, of clock signals external into the PI.

18 Claims, 7 Drawing Sheets

(56) References Cited

OTHER PUBLICATIONS

U.S. Appl. No. 15/680,703, Non Final Office Action dated Jul. 2, 2018.
U.S. Appl. No. 15/680,703, Final Office Action dated Feb. 8, 2019, 7 pgs.
U.S. Appl. No. 15/680,703, Response filed Oct. 2, 2018 to Non Final Office Action dated Jul. 2, 2018, 11 pgs.
U.S. Appl. No. 15/680,703, Advisory Action dated May 1, 2019, 3 pgs.
U.S. Appl. No. 15/680,703, Examiner Interview Summary dated Apr. 19, 2019, 9 pgs.
U.S. Appl. No. 15/680,703, Non Final Office Action dated Jun. 28, 2019, 7 pgs.
U.S. Appl. No. 15/680,703, Response filed Apr. 18, 2019 to Final Office Action dated Feb. 8, 2019, 11 pgs.
"U.S. Appl. No. 15/680,703, Response filed Sep. 18, 2019 to Non-Final Office Action dated Jun. 28, 2019", 11 pgs.
"U.S. Appl. No. 15/680,703, Examiner Interview Summary dated Sep. 19, 2019", 3 pgs.
"U.S. Appl. No. 15/680,703, Final Office Action dated Oct. 4, 2019", 8 pgs.

\* cited by examiner

MULTIPLE INJECTION LOCK RING-BASED PHASE INTERPOLATOR

TECHNICAL FIELD

Embodiments described herein relate to phase interpolators and, in particular, ring-based phase interpolators having multiple injection points.

BACKGROUND

High speed serial data communications (e.g., over serial data TX/RX links) are widely used to convey data over various channels, such as cables, board traces and backplanes. Examples of serial data communications include, without limitation, physical layer interface specifications (e.g., PCIe, SATA, GbE, XAUI, Gigabit Ethernet, USB, etc.) and memory data interface standards (e.g., DDR3, DDR4, LPDDR3, LPDDR4, etc.). With serial data communications, the transmitter usually does not share the same reference clock frequency as the one used by the receiver. This may be due to tolerance between crystal oscillators local to the transmitter or receiver can lead to frequency discrepancies. This may also be due to spread-spectrum modulation, which can cause variation in the phase and frequency of the transmitted signal and must be locally tracked.

As such, serial data communications receivers often use clock and data recovery (CDR) circuitry to recover (with low bit-error rate) an underlying clock signal in a data stream from a transmitter, track the data stream's phase, and decode the data stream accordingly. CDR circuitry generally recovers the underlying clock signal by sampling incoming data bits of the data stream (e.g., at its centers and at their transitions). CDR circuitry can include a phase interpolator (PI) to advance or delay tracking clock signals of the receiver, so as to adjust the effective frequency and phase of those tracking clock signals and generate all the sampling phases needed for recovery of the underlying clock signal. For example, when a tracking clock signal of the receiver leads the incoming data stream, a PI can adjust the local tracking clock so as to slow it down a bit, and when a tracking clock signal of the receiver lags the incoming data stream, the PI can adjust the local tracking clock so as to speed it up a bit. Such adjustments to the tracking clock signal may need be continuously made in order for it to tracking the incoming data stream.

One type of architecture for phase interpolators is current mode logic (CIVIL). With a phase interpolator of the CML type, in-phase (I) and quadrature (Q) clock signals and their complements are used as the reference clock signals. These clock signals are applied to switch on and off differential pairs of transistors coupled to weighted current sources. Some implementations use four differential pairs to generate an output phase value interpolated between any adjacent two of four reference phases corresponding to the differential pairs, such as 0°, 90°, 180°, and 270°.

Unfortunately, phase interpolators (PIs) suffer from their own impairments that can lead to timing errors, which in turn can prevent a receiver from re-sampling an incoming data stream at optimal time points. Integral non-linearity, differential non-linearity, and phase to quadrature skew (e.g., mismatch of an output phase to expected quadrature) can be just some of those impairments.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
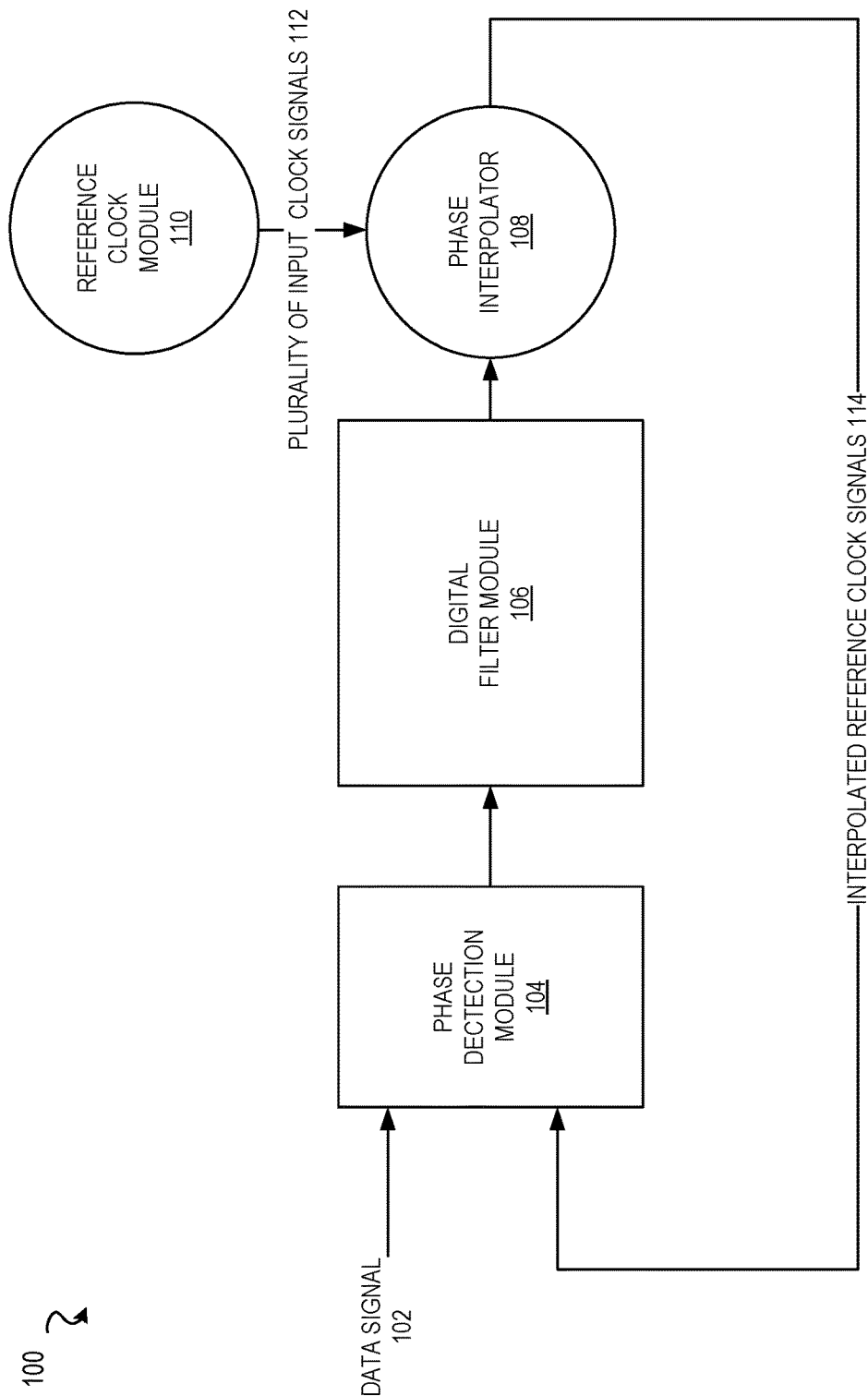
FIG. 1 is a block diagram illustrating example clock data recovery (CDR) circuitry according to some embodiments.

As noted herein, phase interpolators (PIs) suffer from their own impairments that can lead to timing errors, such as inter-phase skew error. Various embodiments described herein relate to multiple injection lock ring-based PIs, which can inject a plurality of clock signals, of different phases, at injection points disposed along the ring chain of the PI and lock phase to those received clock signals (injected clock signals). For instance, an embodiment described herein may provide a multiple injection lock ring-based PI that permits double injection, triple injection, or the like, of clock signals external into the PI. Through an injection point at each delay stage, a ring-based PI of an embodiment may take up to one injection per a delay stage, which can represent two input phases per a delay stage for differential implementations of the ring-based PI (e.g., where a pair of clock signals of complementary phase are being injected into a single delay stage).

For some embodiments, the multiple injection lock ring-based PI comprises a plurality of delay stages in series coupled in cascade within a closed loop, thereby implementing a ring chain of the PI. For instance, the multiple injection lock ring-based PI may comprise at least three delay stages coupled in cascade. Each delay stage can comprise an amplifier (e.g., differential amplifier). Additionally, each delay stage can receive its input (e.g., differential pair input) from the output (e.g., differential pair output) of the previous delay stage in the ring chain. The output (e.g., differential pair output) of a particular delay stage in the ring chain comprises a vector sum of the input (e.g., differential pair input) received from the previous delay stage in the ring chain and the clock signal(s) (e.g., pair of complementary clock signals) injected into the particular delay stage. The phase of this output with reference to the injected clock signal(s) will be a function of relative gains of the differential pairs. If the frequency of the injected clock signals is within a certain range of a free running oscillation frequency of the ring-based PI, the delay stage outputs can lock to the frequency of the injected clock signals.

According to some embodiments, a multiple injection lock ring-based PI comprises four delay stages. The multiple injection lock ring-based PI can receive two or more (e.g., four) equally separated pairs of complementary clock signals (differential clock signals), each of which can be selectively routed to and injected into one or more delay stages in the ring chain. The tail currents of the differential pairs used for injecting the pairs of complementary clock signals can be varied linearly as a function of the phase position vector.

The multiple injection lock ring-based PIs of various embodiments can improve performance over traditional, single injection locked PIs, particularly with respect to linearity and phase to quadrature match. Accordingly, use of some embodiments can improve the performance of serial data receivers. Additionally, excellent I-Q delay characteristics of some embodiments render the multiple injection lock ring-based PIs more suitable than traditional single injection locked PIs for data communication architectures in which the PI is operating at quarter rate.

In particular, a four-delay stage multiple injection lock ring-based PI of an embodiment (which could operate at a quarter rate) can minimize the asymmetry present in a traditional, four-delay stage single injection lock ring-based PI. This asymmetry arises in four-delay stage single injection lock ring-based PI when at any phase vector position, two of ring stages of the four-delay stage single injection lock ring-based PI are injected with linearly varying currents while the other two stages do not receive injection currents. This asymmetry of a single injection lock ring-based PI results in deviations of net stage to stage delay from the ideal value of 45 degrees. The linearity of single injection lock ring-based PIs also degrades at high injection fraction, which is often necessary to guarantee a minimum frequency locking range.

In contrast, the four-delay stage multiple injection lock ring-based PI of an embodiment can inject two or more clock signals into two or more delay stages of the PI, thereby minimizing the asymmetry present in a traditional, four-delay stage single injection lock ring-based PI. Additionally, such a PI can inject two or more clock signals into two or more delay stages with a total injection current that is equal, thereby reducing I-Q skew as a function of phase position.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a block diagram illustrating example clock data recovery (CDR) circuitry 100 according to some embodiments. As shown, the CDR circuitry includes a phase detection module 104 that receives a data signal 102, a digital filter module 106 coupled to the phase detection module 104, a phase interpolator 108 coupled to the phase detection module 104, and a reference clock module 110 coupled to the phase interpolator 108. The clock recovered from the data signal 102 by the CDR circuitry 100 can be used by a receiver (not shown) in decoding data carried within the data signal 102.

The reference clock module 110 generates a plurality of input clock signals 112. The reference clock module 110 may comprise a voltage controlled oscillator (VCO) to synthesize the plurality of input clock signals 112. The phase interpolator 108 receives plurality of input clock signals 112 from the reference clock module 110 and uses the plurality of input clock signals 112 to generate a plurality of interpolated reference clock signals 114, having discrete phases, by advancing or delaying a set of oscillator signals of the phase interpolator 108 based on the plurality of input clock signals 112. In particular, according to various embodiments, the phase interpolator 108 selectively injects two or more of the plurality of input clock signals 112 into delay stages included by the phase interpolator 108 In this way, the phase interpolator 108 can set the phase of the plurality of interpolated reference clock signals 114 as the CDR circuitry 100 attempt to track the underlying clock signal of the data signal 102 based on information provided by the phase detection module 104 via the digital filter module 106.

According to some embodiments, the phase interpolator 108 comprises a ring-based PI and includes circuitry that permits multiple clock injection points to reduce skew error and improve linearity of the plurality of interpolated reference clock signals 114 produced by the phase interpolator 108. The plurality of interpolated reference clock signals 114 can provide the sampling clock signal phases needed by the CDR circuitry 100 to recover a clock signal underlying the data signal 102. Some of the interpolated reference clock signals 114 may be used to sample the center of incoming data bits of the data signal 102, while some may be used to sample transitions between data bits of the data signal 102. The resolution of the CDR circuity 100 may be determined by the number of clock signal phases available.

Depending on the embodiment, the phase interpolator 108 may be configured for a half-rate data sampling system, where based on the plurality of input clock signals 112, the phase interpolator 108 (e.g., by two delay stages) generates interpolated reference clock signals $\Phi_{out0}$ and $\Phi_{out180}$, which can be respectively aligned with the bit centers of the data signal 102, and generates interpolated reference clock signals $\Phi_{out90}$ and $\Phi_{out270}$, which can be respectively aligned with the bit transitions of the data signal 102. Alternatively, the phase interpolator 108 may be configured for a quarter-rate data sampling system, where based on the plurality of input clock signals 112, the phase interpolator 108 (e.g., by four delay stages) generates interpolated reference clock signals $\Phi_{out45}$, $\Phi_{out90}$, $\Phi_{out180}$, and $\Phi_{out270}$, which can be respectively aligned with the bit centers of the data signal 102, and generates interpolated reference clock signals $\Phi_{out45}$, $\Phi_{out135}$, $\Phi_{out225}$, and $\Phi_{out315}$, which can be respectively aligned with the bit transitions of the data signal 102.

For some embodiments, the phase interpolator 108 comprises a ring-oscillator based, lock-injected PI including a plurality of delay stages, such as CML delay stages, that are differential in operation (i.e., each results in a pair of oscillator signals having complementary phases). For instance, a four-delay stage ring-based PI may produce the following pairs of complementary oscillator signals 45 degrees apart: delay stage one produces $\Phi_{out0}$ and $\Phi_{out180}$; delay stage two produces $\Phi_{out45}$ and $\Phi_{out225}$; delay stage three produces $\Phi_{out90}$ and $\Phi_{out270}$; and delay stage four produces $\Phi_{out135}$ and $\Phi_{out315}$. To facilitate this its operation, two or more input clock signals from the plurality of input clock signals 112 can be injected into (e.g., added to and blended with) the oscillator signal traveling through the ring chain of the phase interpolator 108. Injection of an input clock signal into a particular delay stage, when strong enough, can cause the ring to align in phase and frequency with the injected input clock signal. To achieve this, the injection of an input clock signal in a particular delay stage may comprise applying a current bias within the particular delay stage according to the input clock signal. Injection of multiple input clock signals (e.g., each comprising a pair of input clock signals $\Phi_{in}$ and $\Phi_{in-comp}$ having complementary phases) at multiple injection points along the ring chain of the PI may involve injection of each of the multiple input clock signals (e.g., each pair) with respect to a single delay stage or between two adjacent delay stages (where the total amount of the injected input clock signal remains constant but distributed across two delay stages) in the ring chain of the phase interpolator 108. In this way, each of the multiple input clock signals is being localized to an injection point or two injection points along the ring chain of the phase interpolator 108. In some embodiments, injection of the multiple input clock signals at multiple injection points along the ring chain of the PI involves injection of each of the multiple input clock signals at every other delay stage in the ring chain.

Additionally, an injection at a given injection point along the ring chain of the PI can be shifted (e.g., moved) from a first delay stage to an adjacent, second delay stage by increasing the injection strength with respect to the second delay stage and reducing the injection strength with respect to the first delay stage by an equivalent delta. Moving the injection point from one delay stage to another causes a corresponding change to the output phases of the plurality of interpolated reference clock signals 114 produced by the phase interpolator 108. Such shifting may be achieved using a tail current digital-to-analog converter (DAC), in which digital controls can permit, for example, at least 128 unique independent injection positions and, as such, 128 unique output phase positions with respect to the input clock $\Phi_{in0}$.

As shown, the phase interpolator 108 produces the plurality of interpolated reference clock signals 114. Take for instance where the phase interpolator 108 comprises a four delay stages, the plurality of interpolated reference clock signals 114 may comprise the following pairs of complementary oscillator signals: delay stage one produces $\Phi_{out0}$ and $\Phi_{out180}$; delay stage two produces $\Phi_{out45}$ and $\Phi_{out225}$; delay stage three produces $\Phi_{out90}$ and $\Phi_{out270}$; and delay stage four produces $\Phi_{out135}$ and $\Phi_{out315}$.

The phase detection module 104 generates phase information by comparing the data signal 102 with the plurality of interpolated reference clock signals 114 provided by the phase interpolator 108, and outputs the phase information to the digital filter module 106. If one of the plurality of interpolated reference clock signals 114 leads the data signal 102, the phase detection module 104 sends a signal through the digital filter module 106. If one of the plurality of interpolated reference clock signals 114 lags the data signal 102, the phase detection module 104 sends a signal through the digital filter module 106. The digital filter module 106 uses the provided phase information to calculate and output to the phase interpolator 108 information (e.g., control signals) needed to adjust one or more of the plurality of input clock signals 112.

Figure 2:
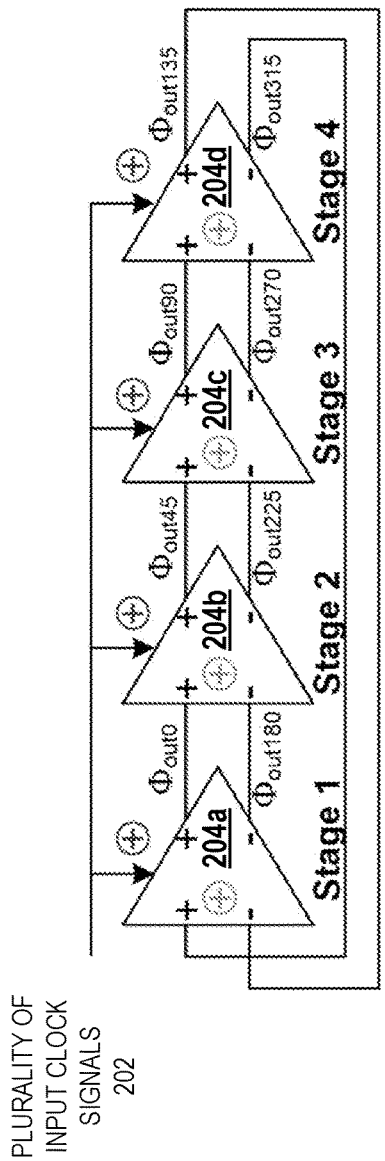
FIG. 2 is a diagram illustrating an example phase interpolator capable of multiple injection lock in accordance with some embodiments.

FIG. 2 is a diagram illustrating an example phase interpolator 200 capable of multiple injection lock in accordance with some embodiments. As shown, the phase interpolator 200 includes four delay stages 204a, 204b, 204c, 204d (collectively referred to as delay stages 204), each having an injection point that can receive a plurality of input clock signals 202 of having different phases (e.g., equally separated).

According to various embodiments, each of the delay stages 204 selectively applies (e.g., injects) at least one clock signal from the plurality of input clock signals 202. In this way, the phase interpolator 200 can be injection locked to multiple clock signals of different phases. The plurality of input clock signals 202 can be selectively injected according to an input code (not shown) received by the phase interpolator 200. For some embodiments, all of the plurality of input clock signals 202 are routed to, and received by, an injection point at each of the delay stages 204 such that each of the delay stages 204 can then selectively inject an input clock signal from the plurality of input clock signals 202 into its output. Alternatively, an input clock signal from the plurality of input clock signals 202 may be selectively routed to an injection point at one of the delay stages 204, which will then inject whatever input clock signal is routed to the delay stage.

In FIG. 2, the delay stages 204 are coupled in cascade within a closed loop, thereby implementing a ring chain of the phase interpolator 200. As such, each of the delay stages 204 receives the differential output of the delay stage that precedes it in the closed loop, and each of the delay stages 204 provides its differential output to delay stage that follows it in the closed loop. Additionally, each of the delay stages 204 may comprise a differential amplifier to facilitate its operation. In cascade, the delay stages 204 can collectively execute a number of signal state inversions within the closed loop. As shown, for some embodiments, delay stages 206 adjacent to each other in the closed loop are interconnected. In particular, the output oscillator signals $\Phi_{out0}$ and $\Phi_{out180}$ of delay stage 204a, the output oscillator signals $\Phi_{out45}$ and $\Phi_{out225}$ of delay stage 204b are received as inputs by the delay stage 204c, the output oscillator signals $\Phi_{out90}$ and $\Phi_{out270}$ of delay stage 204c are received as inputs by the delay stage 204d, and the output oscillator signals $\Phi_{out135}$ and $\Phi_{out315}$ of delay stage 204d are received as inputs by the delay stage 204a. According to various embodiments, the output oscillator signals produced by the delay stages 204 of the phase interpolator 200 can be used as interpolated reference clock signals (e.g., in the CDR circuitry 100) as described herein.

As noted herein, each of the delay stages 204 also receives the plurality of input clock signals 202, two or more of which can be selectively injected into two or more of the delay stages 204 as described herein. According to some embodiments, the plurality of input clock signals 202 comprises one or more pairs of complementary clock signals (e.g., clock signals $\Phi_{in}$ and $\Phi_{in-comp}$ having complementary phases), which may be synthesized by a voltage controlled oscillator (VCO). For instance, the plurality of input clock signals 202 could comprise the plurality of input clock signals 202 could comprise a pair of complementary clock signals $\Phi_0$ and $\Phi_{180}$ and another pair of complementary clock signals $\Phi_{90}$ and $\Phi_{270}$, and the phase interpolator 200 can selectively inject complementary clock signals $\Phi_0$ and $\Phi_{180}$ to one of the delay stages 204 (e.g., 204b) and complementary clock signals $\Phi_{90}$ and $\Phi_{270}$ to another one of the delay stages 204 (e.g., 204d). For some embodiments, the plurality of input clock signals 202 comprises the following four equally separated differential pairs of clock signals: $\Phi_{in0}$ and $\Phi_{in180}$; $\Phi_{in45}$ and $\Phi_{in135}$; $\Phi_{in90}$ and $\Phi_{in270}$; and $\Phi_{in135}$ and $\Phi_{in315}$. The pairs of complementary clock signals included by the plurality of input clock signals 202 can vary from this for other embodiments.

Though FIG. 2 illustrates an embodiment comprising a four-delay stage ring-based PI, alternative embodiments may differ with respect to components, configuration, or both. For instance, an alternative embodiment may comprise more or less delay stages than what is illustrated in FIG. 2 (e.g., six-delay stage ring-based PI that provides output oscillator signals 60 degrees apart, or five-delay stage ring-based PI that provides output oscillator signals 36 degrees apart).

Figure 3:
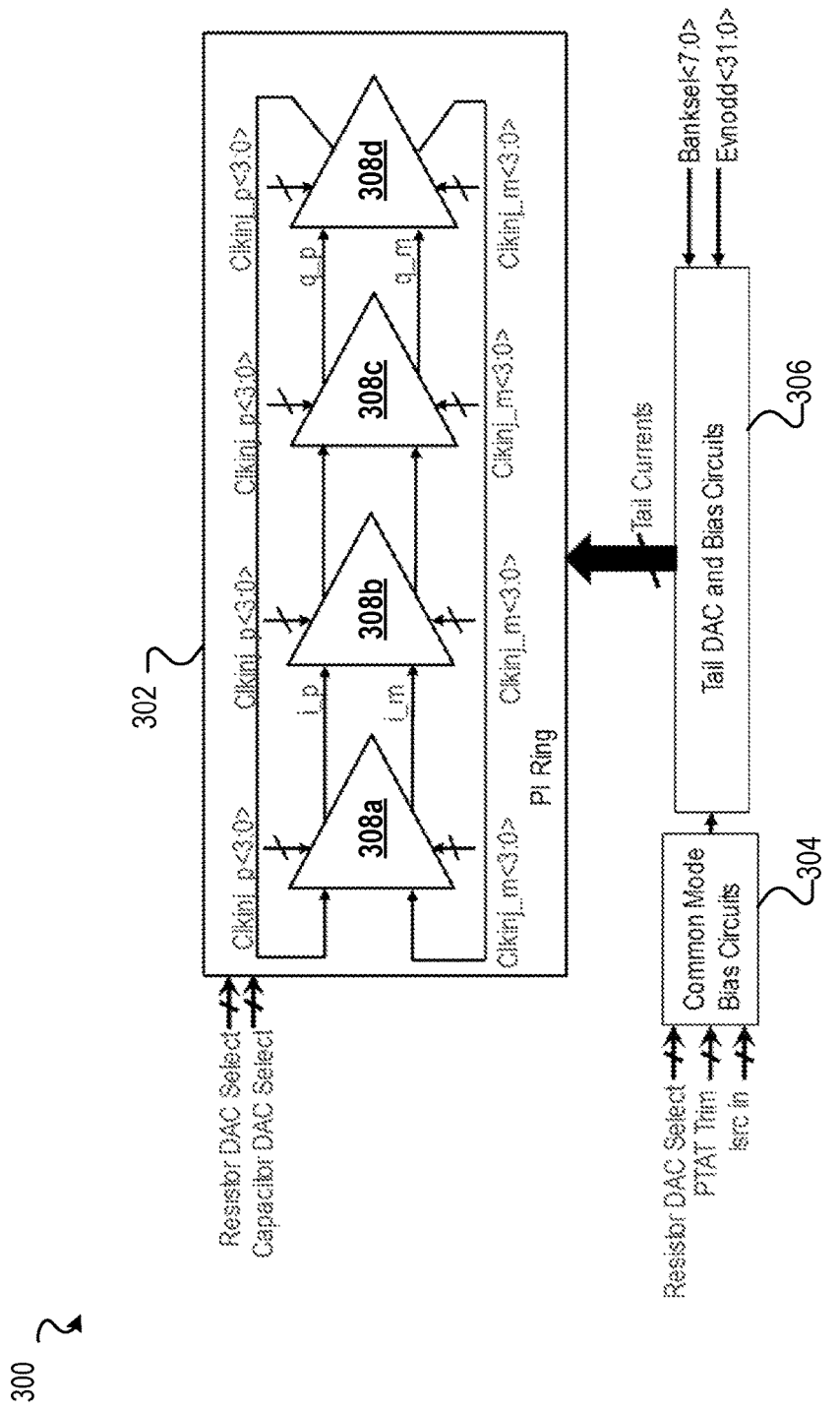
FIG. 3 is a diagram illustrating an example phase interpolator capable of multiple injection lock, based on a set of input codes, in accordance with some embodiments.

FIG. 3 is a diagram illustrating an example phase interpolator 300 capable of multiple injection lock, based on a set of input codes, in accordance with some embodiments. As shown, the phase interpolator 300 includes a phase interpolator ring 302, common mode bias circuits 304, and tail digital-analog-converter (DAC) and bias circuits 306. The phase interpolator ring 302 includes four delay stages 308a, 308b, 308c, and 308d (collectively referred to as delay stages 308), each having an injection point that can receive four input clock signals Clkinj_p<3:0> (e.g., equally separated in phase) and four, complementary input clock signals Clkinj_m<3:0> (e.g., equally separated in phase). The four input clock signals Clkinj_p<3:0> may represent a first half of four differential clock pairs, and the four input clock signals Clkinj_m<3:0> may represent a second half of four differential clock pairs. As such, Clkinj_p<3:0> and Clkinj_m<3:0> can represent four differential clock signal pairs that can be received by the injection points of the delay stages 308 and selective injected. For instance, the four input clock signals Clkinj_p<3:0> may comprise input clock signals $\Phi_{in0}$, $\Phi_{in45}$, $\Phi_{in90}$, and $\Phi_{in135}$ and the four input clock signals Clkinj_m<3:0> may comprise input clock signals $\Phi_{in180}$, $\Phi_{in135}$, $\Phi_{in270}$, and $\Phi_{in315}$. The i_p, i_m, q_p, and q_m labels represent nodes of the phase interpolator ring 302 for in-phase and quadrature output clock signals. During calibration mode (e.g., when the free running frequency of the phase interpolator ring 302 is calibrated), the external clock signal inputs (e.g., four injection differential pairs) to the injection points of the delay stages 308 can be grounded using input buffers gated by a calibration enable input.

For some embodiments, the phase interpolator ring 302 oscillates at free running oscillation frequency determined by a resistive pull up of each amplifier included by each of the delay stages 308, and by the capacitive load at the output of each of the delay stages 308. Though not shown, the phase interpolator ring 302 may include a resistor digital-to-analog-converter (DAC) that controls a bank of pull-up resistors coupled to the amplifiers of the delay stage 308, and a capacitor digital-to-analog-converter (DAC) that controls a bank of capacitors coupled to outputs of the delay stages 308. As shown, the phase interpolator ring 302 includes a resistor DAC select input, which can control the resistor DAC, and a capacitor DAC select input, which can control the capacitor DAC. In this way, the resistor DAC select input and the capacitor DAC select input can be utilized to set and calibrate the free running oscillation frequency of the phase interpolator ring 302.

According to some embodiments, based on a set of input codes, the phase interpolator 300 controls the phase of the output clock signals with respect to the input clock signals Clkinj_p<3:0> and Clkinj_m<3:0>. In this way, the phase interpolator 300 can implement a plurality of output clock signals with a certain number of unique phase positions (e.g., 28 unique phase positions) based on the set of input codes. For instance, as shown, the tail DAC and bias circuits 306 receives a 40-bit digital bus input including a Banksel<7:0> and Evnodd<31:0> bits. Based on translating the 40-bit digital bus input, the tail DAC and bias circuits 306 can cause the phase interpolator ring 302 to generate 28 phase positions. In particular, the tail DAC and bias circuits 306 may control (e.g., through the tail current array) the tail currents provided to individual ones of the delay stages 308 in the phase interpolator ring 302. By controlling the tail currents provided to individual delay stages 308, the tail DAC and bias circuits 306 can cause the phase of the output clock signals to rotate.

As shown, the tail DAC and bias circuits 306 is controlled or influenced by the common mode bias circuits 304, which can receive as inputs $I_{src}$ in, PTAT trim, and the resistor DAC select noted above. The $I_{src}$ in can set the current source value for the delay stages 308, while the PTAT trim input can receive the thermometer code that controls the tail current array.

Figure 4A:
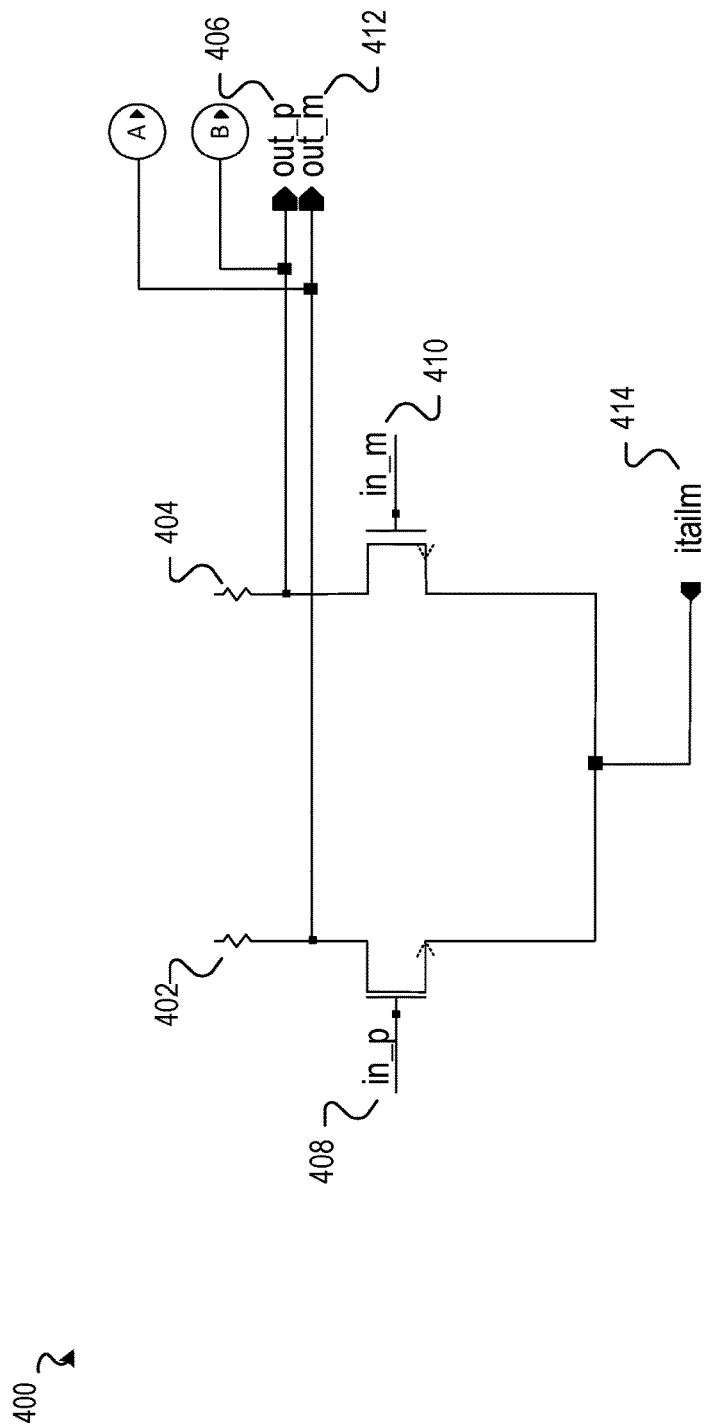
FIGS. 4A and 4B provide a circuit diagram illustrating an example delay stage according to some embodiments.
Figure 4B:
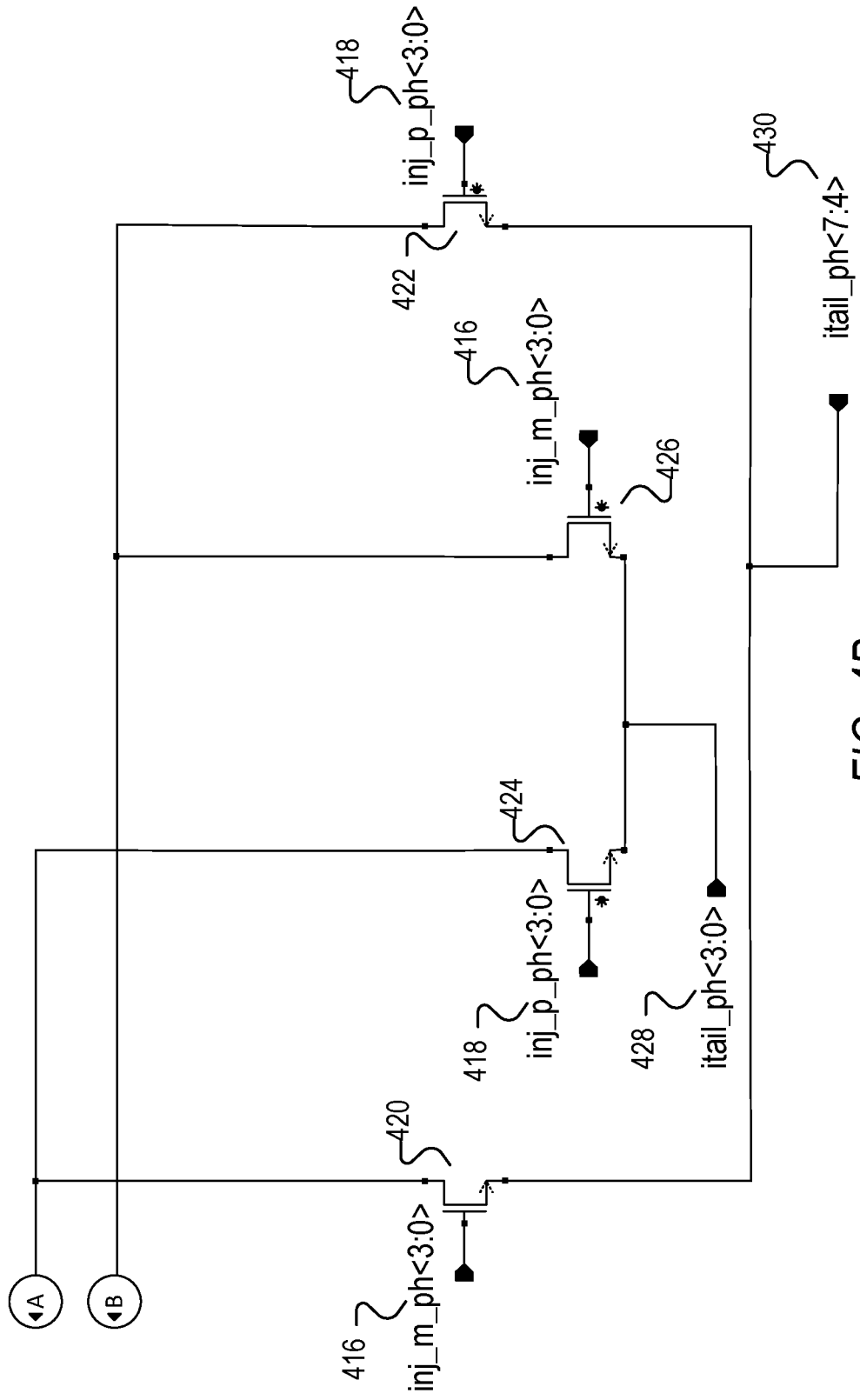

FIGS. 4A and 4B provide a circuit diagram illustrating an example delay stage 400 according to some embodiments. As shown in FIG. 4A, the delay stage 400 comprises pull-up resistors 402 and 404, transistors 408 and 410, and nodes out_p 406, out_m 412, and itailm 414. As shown in FIG. 4B, the delay stage 400 further comprises transistor arrays 416, 418, 420, and 422, and nodes tail_ph_a<3:0>424 and tail_ph_b<3:0>426.

In particular, node out_p 406 represents the positive output of the delay stage 400, which provides one output clock signal from the delay stage 400, and node out_m 412 represents the minus output of the delay stage 400, which provides the other output clock signal from the delay stage 400. The gate of the transistor 408 is coupled to node in_p (which represents the positive differential input of the delay stage 400), the drain of the transistor 408 is coupled to the pull-up resistor 402. The sources of transistors 408 and 410 are coupled to node itailm 414, which provides the tail current of the main amplifier and may be controlled (e.g., via the tail DAC and bias circuits 306) to rotate the phase of the output clock signals provided by node out_p 406 and node out_m 412. The gate of the transistor 410 is coupled to node in_m (which represents the minus differential input of the delay stage 400), and the drain of the transistor 410 is coupled to the pull-up resistor 404. Labels A and B are meant to indicate that the output clock signals of nodes out_p 406 and out_m 412 are respectively coupled to a circuit illustrated in FIG. 4B.

Turning now to FIG. 4B, the circuit illustrated represents a signal injection portion (e.g., the injection differential pair array) of the delay stage 400. As shown, the signal injection portion of FIG. 4B includes transistor arrays 420, 422, 424, and 426. For some embodiments, each of the transistor arrays 420, 422, 424, and 426 comprise at least the same number of transistors as differential clock pairs being received by the injection point of the delay stage 400, with each of those transistors having a lead coupled to a different clock signal input. In FIG. 4B, node inj_m_ph<3:0>416 represents the minus injection point of the delay stage 400 that receives four different clock signals, which can represent a first half of the four differential clock signal pairs coupled to a phase interpolator for injection. The node inj_p_ph<3:0>418 represents the positive injection point of the delay stage 400 that receives four different clock signals, which can be coupled to a second half of the four differential clock signal pairs coupled to a phase interpolator for injection. Accordingly, as configured, the signal injection portion of the delay stage 400 can implement injection from one of four differential clock signal pairs provided by way of nodes inj_m_ph<3:0>416 and inj_p_ph<3:0>418.

The gates of the transistor array 420 are coupled to node inj_m_ph<3:0>416, and the drains of the transistor array 420 are coupled, with the drains of the transistor array 424, to the node out_m 412. The transistor arrays 420 and 422 are coupled at their source nodes to itail_ph<3:0>428, which provides the tail current for the transistor arrays 420 and 422. The gates of the transistor array 422 are coupled to node inj_p_ph<3:0>418, and the drains of the transistor array 422 are coupled, with the drains of the transistor array 426, to the node out_p 406. The transistor arrays 424 and 426 are coupled at their source nodes to itail_ph<7:4>430, which provides the tail current for the transistor arrays 424 and 426. The itail_ph<3:0>428 and the itail_ph<7:4>430 may be controlled by a tail DAC and bias circuits (e.g., 306) to selectively inject the external clock signals coupled to the transistor arrays 420, 422, 424, and 426.

Figure 5:
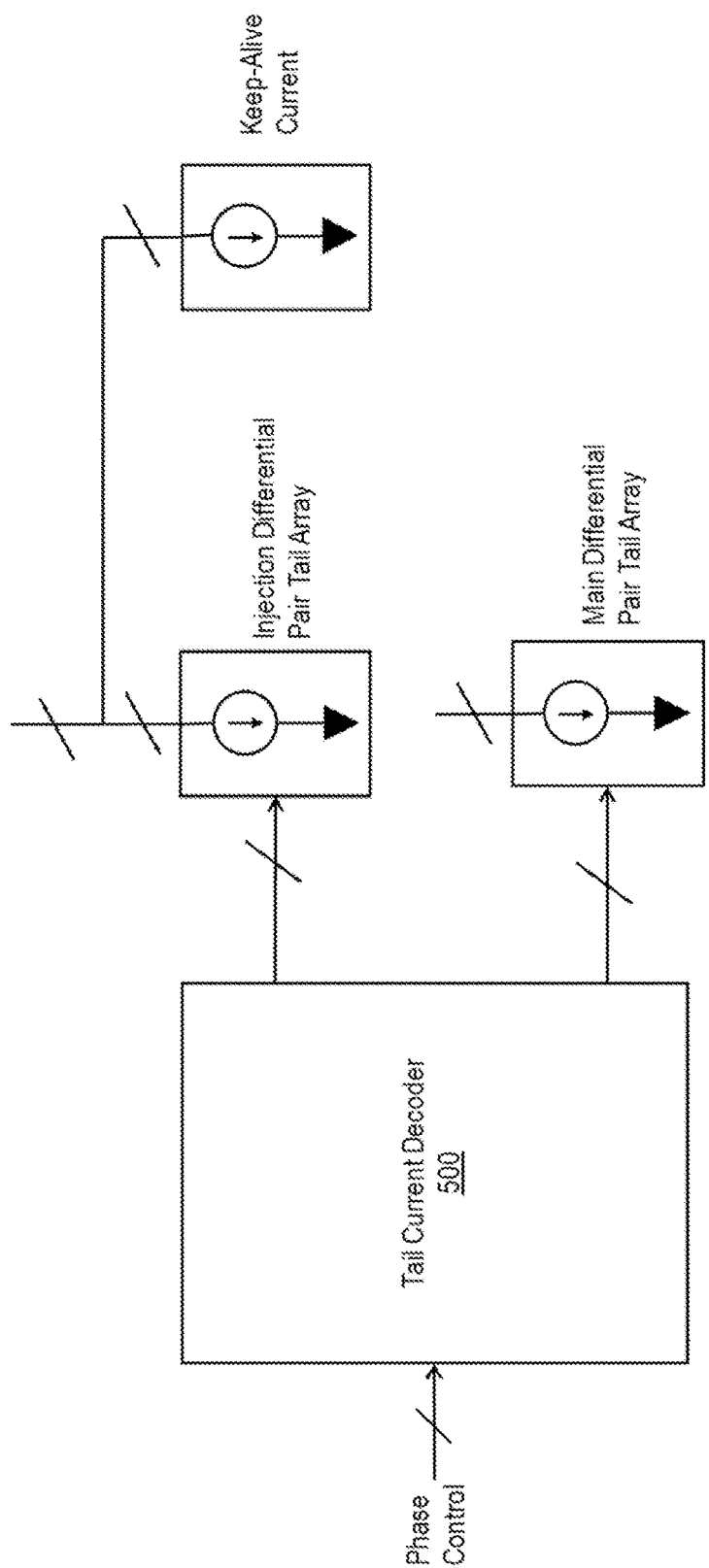
FIG. 5 is a diagram illustrating an example tail current decoder of a phase interpolator capable of multiple injection lock, in accordance with some embodiments.

FIG. 5 is a diagram illustrating an example tail current decoder 500 of a phase interpolator capable of multiple injection lock, in accordance with some embodiments. According to some embodiments, the tail current decoder 500 comprises a tail DAC described herein. As shown, the tail current decoder 500 receives a phase control input and, based on the phase control input, outputs tail currents that control an injection differential pair tail array and tail currents that control a main differential pair array. By controlling the injection differential pair tail array, the tail current decoder 500 can control injection positions of the phase interpolator. By controlling the main differential pair array, the tail current decoder 500 can control rotation of a phase of output clock signals within the phase interpolator.

Figure 6:
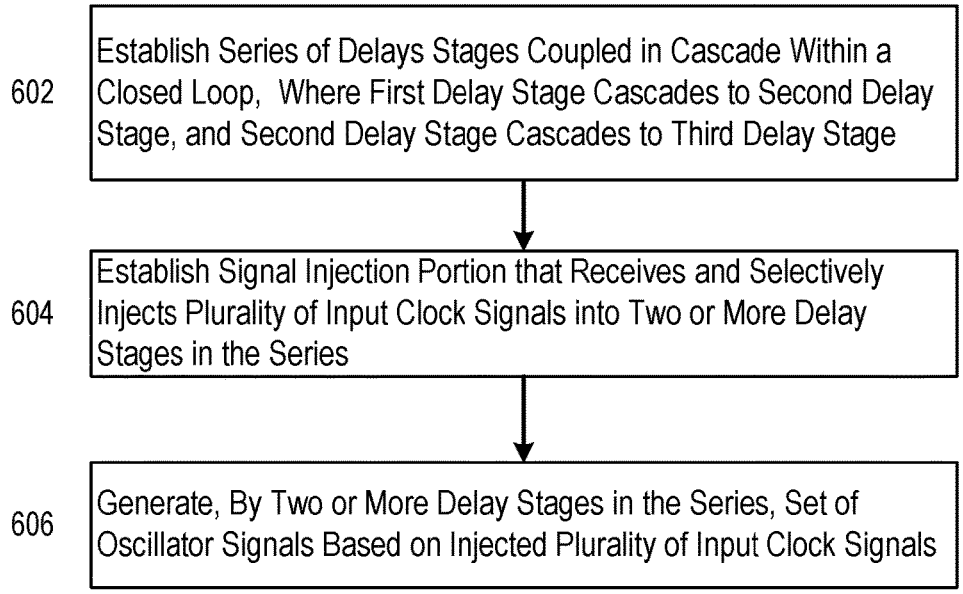
FIG. 6 is a flowchart illustrating an example method for a multiple injection lock ring-based phase interpolator according to some embodiments.

FIG. 6 is a flowchart illustrating an example method 600 for a multiple injection lock ring-based phase interpolator according to some embodiments.

As shown, the method 600 begins with operation 602 establishing a series of delay stages (e.g., the delay stages 204 of the phase interpolator 200) coupled in cascade within a closed loop. As used herein, establishing the series of delay stages (or any other component described herein) may include, for example, installing, incorporating, implementing, or designing (e.g., via an electronic design automation [EDA] software tool) the series of delay stages. The series may be configured such that: a first delay stage (e.g., the delay stage 204a) of the series has a first set of outputs; a second delay stage (e.g., the delay stage 204b) of the series has a second set of outputs; the first delay stage is coupled in cascade to the second delay stage such that the first set of outputs is received by the second delay stage as inputs; and the second delay stage is coupled in cascade to a third delay stage of the series such that the second set of outputs is received by a third delay stage of the series as inputs. Depending on the embodiment, the series of delay stages may comprise three or more delay stages. For instance, in a quarter-rate data sampling system, the series of delay stages may comprise four delay stages interconnected in cascade within the closed loop, which can provide output oscillator signals 45 degrees apart. In other instances, the series of delay stages may comprise six delay stages interconnected in cascade within the closed loop, which can provide output oscillator signals 60 degrees apart, or five-delay stages interconnected in cascade within the closed loop, which can provide output oscillator signals 36 degrees apart.

The method 600 continues with operation 604 a signal injection portion that receives and selectively injects a plurality of input clock signals into two or more delay stages in the series (e.g., established at operation 602). Establishing the signal injection portion may include, for example, installing, incorporating, implementing, or designing the output buffer. As noted herein, the plurality of input clock signals may be external to the phase interpolator, comprise differential pairs of clock signals, and may be generated by a voltage controlled oscillator (VCO).

For some embodiments, the signal injection portion can selectively inject the plurality of input clock signals into the series of delay stages (established at operation 602) by injecting a first set of input clock signals, from the plurality of input clock signals, into the first delay stage, and injecting a second set of input clock signals, from the plurality of input clock signals, into the third delay stage. In this way, the first set of outputs may comprise a first set of differential clocks generated by the first delay stage based on the first set of input clock signals injected into the first delay stage and based on the input the first delay stage receives from a delay stage preceding it in the closed loop. Likewise, the third set of outputs may comprise a second set of differential clocks generated by the third delay stage based on the second set of input clock signals injected into the third delay stage and based on input the third delay stage receives from the second delay stage, which precedes it in the closed loop.

As discussed herein, the third delay stage may have a third set of outputs, and the third delay stage may be coupled in cascade to a fourth delay stage of the series such that the third set of outputs is received by the fourth delay stage as inputs. Additionally, the fourth delay stage may have a fourth set of outputs, and the fourth delay stage may be coupled in cascade to the first delay stage such that the fourth set of outputs is received by the first delay stage as inputs. In this way, various embodiments, can establish a four-delay stage multiple injection lock ring-based phase interpolator.

In various embodiments, injecting an input clock signal involves injecting the input clock signal into two neighboring delay stages (e.g., 50% power to the first delay stage and 50% power to the second delay stage). For another instance, the set of input clock signals 202 could comprise a pair of complementary clock signals $\Phi_0$ and $\Phi_{180}$ and another pair of complementary clock signals $\Phi_{90}$ and $\Phi_{270}$. In this implementation, the phase interpolator can selectively inject complementary clock signals $\Phi_0$ and $\Phi_{180}$ to the first delay stages and complementary clock signals $\Phi_{90}$ and $\Phi_{270}$ to the second delay stage. As such, for some embodiments, the signal injection portion receives and selectively injects the plurality of input clock signals by injecting a first set of input clock signals, from the plurality of input clock signals, into the first delay stage and into the second delay stage such that the power of first set of input clock signals is divided between the first delay stage and the second delay stage (e.g., 50-50). Concurrently, the signal injection portion may receive and selectively inject a second set of input clock signals, from the plurality of input clock signals, into the third delay stage and into the fourth delay stage such that the power of second set of input clock signals is divided between the third delay stage and the fourth delay stage (e.g., 50-50).

The method 600 continues with operation 606 generating, by the two or more delay stages in the series (injected into at operation 604), a set of oscillator signals based on the injected plurality of input clock signals. As noted herein, the output (e.g., differential pair output) of a particular delay stage in the closed loop comprises a vector sum of the input (e.g., differential pair input) received from the previous delay stage in the closed loop and the injected input clock signal(s) injected into the particular delay stage. The phase of this output with reference to the injected clock signal(s) will be a function of relative gains of the differential pairs. If the frequency of the injected clock signals is within a certain range of a free running oscillation frequency of the PI, the delay stage outputs can lock to the frequency of the injected clock signals.

Certain embodiments are described herein as including logic or a number of components, modules, elements, or mechanisms. Such modules can constitute hardware modules. A "hardware module" is a tangible unit capable of performing certain operations and can be configured or arranged in a certain physical manner. In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like.

The use of words and phrases such as "one or more," "at least," "but not limited to" or other like phrases shall not be read to mean that the narrower case is intended or required in instances where such broadening phrases may be absent.

Boundaries between various resources, operations, and modules are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A phase interpolation circuit comprising:
a series of delay stages coupled in cascade within a closed loop, a first delay stage of the series having a first set of outputs, a second delay stage of the series having a second set of outputs, a third delay stage having a third set of outputs, and a last delay stage having a last set of outputs, the first delay stage coupled in cascade to the second delay stage such that the first set of outputs is received by the second delay stage as inputs, the second delay stage coupled in cascade to a third delay stage of the series such that the second set of outputs is received by the third delay stage of the series as inputs, the last delay stage coupled in cascade to the first delay stage such that the last set of outputs is received by the first delay stage as inputs, and the last set of outputs comprising complementary oscillator signals;
a signal injection portion that receives and selectively injects a plurality of input clock signals into two or more delay stages in the series by injecting a first set of input clock signals, from the plurality of input clock signals, into the first delay stage and into the second delay stage, the power of the first set of input clock signals being divided between the first delay stage and the second delay stage; and
tail digital-to-analog converter and bias circuits that receive a digital input, generate a set of tail currents based on an input code provided by the digital input, and provide the set of tail currents to the series of delay stages, the set of tail currents causing phase rotation with respect to the first set of outputs, the second set of outputs, and the last set of outputs.

2. The phase interpolation circuit of claim 1, wherein the signal injection portion selectively injects the plurality of input clock signals by further injecting a second set of input clock signals, from the plurality of input clock signals, into the third delay stage.

3. The phase interpolation circuit of claim 2, wherein the first set of outputs comprises a first set of differential clocks generated by the first delay stage based on the first set of input clock signals injected into the first delay stage, and a third set of outputs of the third delay stage comprises a second set of differential clocks generated by the third delay stage based on the second set of input clock signals injected into the third delay stage.

4. The phase interpolation circuit of claim 1, wherein the third delay stage has a third set of outputs, and the third delay stage is coupled in cascade to a fourth delay stage of the series such that the third set of outputs is received by the fourth delay stage as inputs.

5. The phase interpolation circuit of claim 4, wherein the last delay stage comprises the fourth delay stage, the last set of outputs comprising the fourth set of outputs, and the fourth delay stage is coupled in cascade to the first delay stage such that the fourth set of outputs is received by the first delay stage as inputs.

6. The phase interpolation circuit of claim 4, wherein the signal injection portion receives and selectively injects the plurality of input clock signals by further injecting a second set of input clock signals, from the plurality of input clock signals, into the third delay stage and into the fourth delay stage, the power of the second set of input clock signals being divided between the third delay stage and the fourth delay stage.

7. The phase interpolation circuit of claim 1, wherein the plurality of input clock signals comprises a plurality of differential clock signal pairs separated in phase.

8. The phase interpolation circuit of claim 1, wherein the plurality of input clock signals comprises a first clock signal, a second clock signal, a third clock signal, and a fourth clock signal, the second clock signal separated in phase from the first clock signal by 45 degrees, the third clock signal separated in phase from the first clock signal by 90 degrees, and the fourth clock signal separated in phase from the first clock signal by 135 degrees.

9. The phase interpolation circuit of claim 8, wherein the plurality of input clock signals further comprises a fifth clock signal, a sixth clock signal; a seventh clock signal, and an eighth clock signal, the fifth clock complementing the phase of the first clock signal, the sixth clock complementing the phase of the second clock signal, the seventh clock complementing the phase of the third clock signal, and the eighth clock complementing the phase of the fourth clock signal.

10. A method comprising:
establishing a series of delay stages coupled in cascade within a closed loop, a first delay stage of the series having a first set of outputs, a second delay stage of the series having a second set of outputs, a third delay stage having a third set of outputs, and a last delay stage having a last set of outputs, the first delay stage coupled in cascade to the second delay stage such that the first set of outputs is received by the second delay stage as inputs, the second delay stage coupled in cascade to a third delay stage of the series such that the second set of outputs is received by the third delay stage of the series as inputs, the last delay stage coupled in cascade to the first delay stage such that the last set of outputs is received by the first delay stage as inputs, and the last set of outputs comprising complementary oscillator signals;

establishing a signal injection portion that receives and selectively injects a plurality of input clock signals into two or more delay stages in the series by injecting a first set of input clock signals, from the plurality of input clock signals, into the first delay stage and into the second delay stage, the power of the first set of input clock signals being divided between the first delay stage and the second delay stage;

establishing tail digital-to-analog converter and bias circuits that receive a digital input, generate a set of tail currents based on an input code provided by the digital input, and provide the set of tail currents to the series of delay stages, the set of tail currents causing phase rotation with respect to the first set of outputs, the second set of outputs, and the last set of outputs; and generating, by the two or more delay stages in the series, a set of oscillator signals based on the injected plurality of input clock signals.

11. The method of claim 10, wherein the signal injection portion selectively injects the plurality of input clock signals by further injecting a second set of input clock signals, from the plurality of input clock signals, into the third delay stage.

12. The method of claim 11, wherein the first set of outputs comprises a first set of differential clocks generated by the first delay stage based on the first set of input clock signals injected into the first delay stage, and the third set of outputs comprises a second set of differential clocks generated by the third delay stage based on the second set of input clock signals injected into the third delay stage.

13. The method of claim 10, wherein the third delay stage has a third set of outputs, and the third delay stage is coupled in cascade to a fourth delay stage of the series such that the third set of outputs is received by the fourth delay stage as inputs.

14. The method of claim 13, wherein the last delay stage comprises the fourth delay stage, the last set of outputs comprising the fourth set of outputs, and the fourth delay stage is coupled in cascade to the first delay stage such that the fourth set of outputs is received by the first delay stage as inputs.

15. The method of claim 13, wherein the signal injection portion receives and selectively injects the plurality of input clock signals by further injecting a second set of input clock signals, from the plurality of input clock signals, into the third delay stage and into the fourth delay stage, the power of the second set of input clock signals being divided between the third delay stage and the fourth delay stage.

16. The method of claim 10, wherein the plurality of input clock signals comprises a plurality of differential clock signal pairs separated in phase.

17. The method of claim 10, wherein the plurality of input clock signals comprises a first clock signal, a second dock signal, a third clock signal, and a fourth clock signal, the second clock signal separated in phase from the first clock signal by 45 degrees, the third clock signal separated in phase from the first clock signal by 90 degrees, and the fourth clock signal separated in phase from the first clock signal by 135 degrees.

18. The method of claim 17, wherein the plurality of input clock signals further comprises a fifth clock signal, a sixth clock signal, a seventh clock signal, and an eighth clock signal, the fifth clock complementing the phase of the first clock signal, the sixth clock complementing the phase of the second clock signal, the seventh clock complementing the phase of the third clock signal, and the eighth clock complementing the phase of the fourth clock signal.

* * * * *